United States Patent [19]

Nakahara et al.

[11] Patent Number: 4,785,990

[45] Date of Patent: Nov. 22, 1988

[54] ELECTRONIC COMPONENT WITH LEAD TERMINALS AND METHOD OF MANUFACTURING SAID ELECTRONIC COMPONENT

[75] Inventors: Kunikazu Nakahara; Kazuhiro Yasuda, both of Kyoto, Japan

[73] Assignee: Murata Manufacturing Co., Ltd., Japan

[21] Appl. No.: 891,557

[22] Filed: Jul. 29, 1986

[30] Foreign Application Priority Data

Jul. 31, 1985 [JP] Japan .................................. 60-170503
Jul. 31, 1985 [JP] Japan .................................. 60-170506

[51] Int. Cl.[4] ............................................ B23K 31/02
[52] U.S. Cl. .................................. 228/170; 228/173.6; 228/180.2; 29/827
[58] Field of Search ................... 228/170, 180.2, 173.6; 29/827, 846

[56] References Cited

U.S. PATENT DOCUMENTS

| | | | |
|---|---|---|---|
| 3,544,857 | 12/1970 | Byrne et al. | 228/180.2 |
| 3,982,317 | 9/1976 | Eysermans | 228/180.2 |
| 4,232,815 | 11/1980 | Nakano et al. | 228/180.2 |
| 4,396,140 | 8/1983 | Jaffe et al. | 228/180.1 |

Primary Examiner—Nicholas P. Godici
Assistant Examiner—Karen Skillman
Attorney, Agent, or Firm—Ostrolenk, Faber, Gerb & Soffen

[57] ABSTRACT

An electronic component with lead terminals, includes an electronic component element, electrodes respectively formed on opposite end faces of the electronic component element, and lead terminals respectively connected to the electrodes for electrical conduction, and each of the lead terminals having a large width portion formed at one end of its small width tip portion, and the large width portions of the lead terminals being conductively connected to the electrodes of the electronic component element. The disclosure is also directed to a method of manufacturing such electronic component.

6 Claims, 7 Drawing Sheets

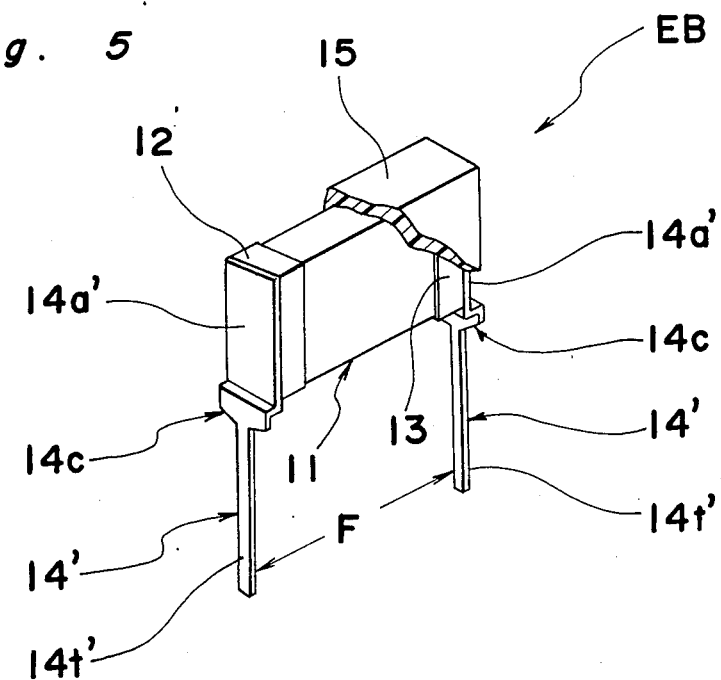
Fig. 5
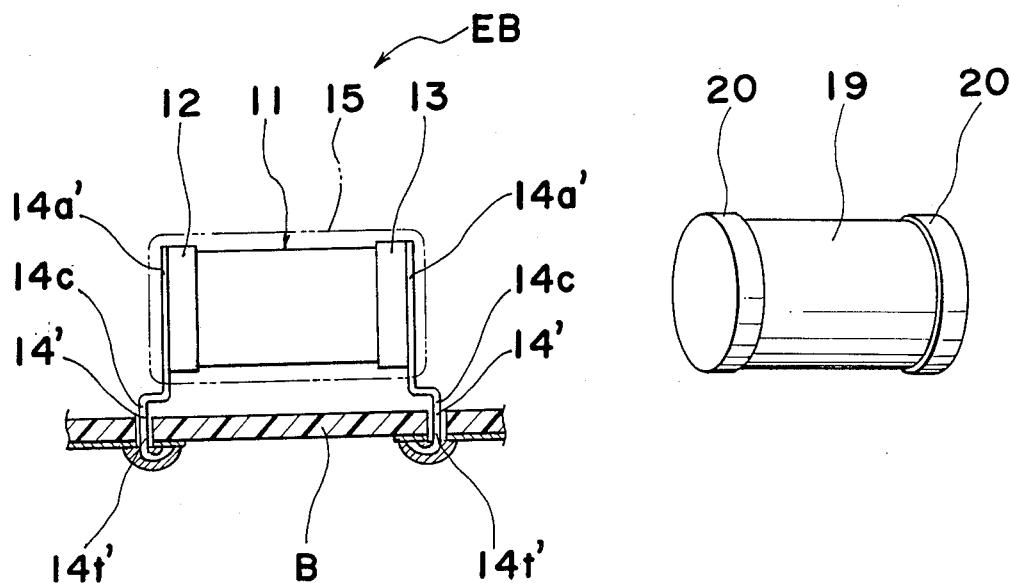
Fig. 6
Fig. 7

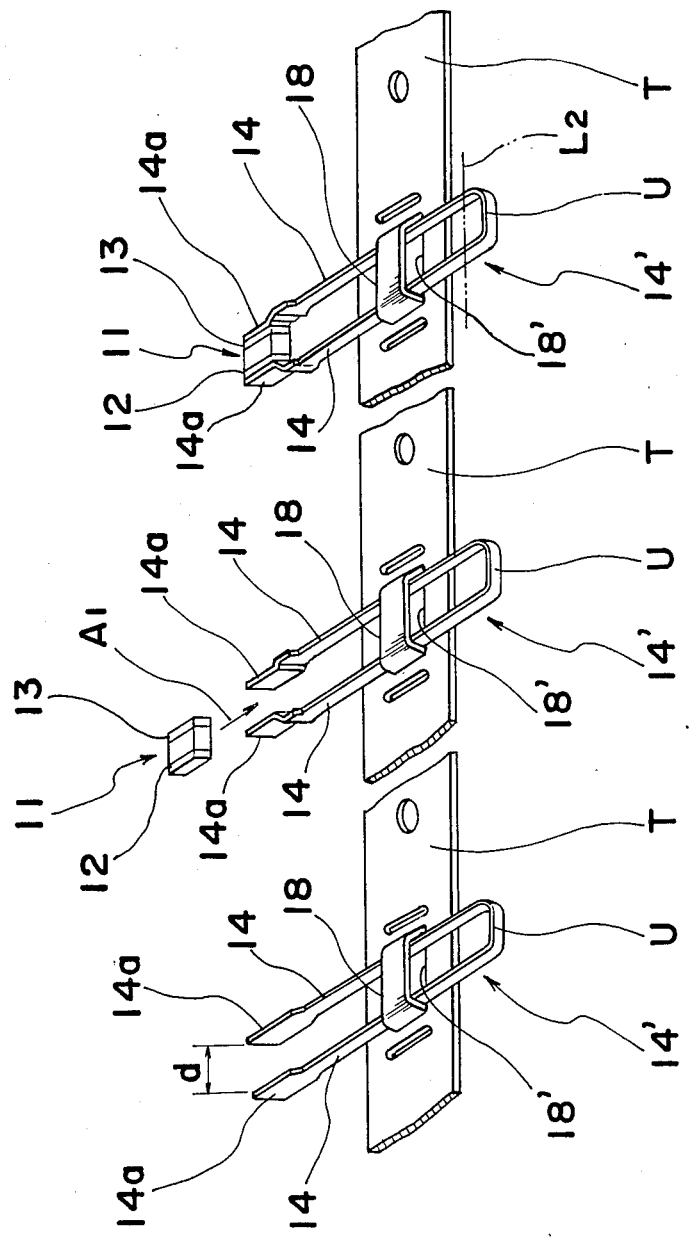

ELECTRONIC COMPONENT WITH LEAD TERMINALS AND METHOD OF MANUFACTURING SAID ELECTRONIC COMPONENT

BACKGROUND OF THE INVENTION

The present invention generally relates to an electronic component having lead terminals led out from respective opposite sides thereof, and a method of manufacturing such an electronic component.

Conventionally, with respect to the electronic components having lead terminals of the type referred to above, there has been known an arrangement as shown in FIG. 1 in which lead terminals 4, each having a circular cross section and formed with a flat portion 4a at one end, are soldered at said flat portions 4a, onto electrodes 2 and 3 respectively formed on opposite end faces of a chip type electronic component element 1, such as a multilayer chip type capacitor or the like, with said electronic component element 1 being covered by a coating layer or resin (not particularly shown). Each of said lead terminals 4 is formed with an annular protrusion 4b for positioning when the electronic component is actually mounted onto a printed circuit board (not shown).

For the manufacture of the electronic component with the lead terminals as described above, a wire of copper or the like having a circular cross section and wound on a reel (not shown) is first led out from the reel and cut into a length approximately two times that of the lead terminal 4, and the piece of wire thus cut off, and curved in an arcuate form due to winding on the reel, is stretched into a straight line.

Thereafter, as shown in FIG. 2(A), the cut wire 4' is bent into a U-shape, and at its bent portion 5, is inserted into one slit 7 of slits 7 and 7' formed in a holder tape 6 made of cardboard, resinous film or the like so as to extend from the front face of the holder tape 6 toward the rear face thereof, and further, led into the other slit 7' so as to be directed from the rear face of said tape 6 onto the front face thereof, with the wire 4' thus being held by the holding tape 6.

Subsequently, the opposite end portions of the wire 4' are processed to form the flat portions 4a and 4a and annular protrusions 4b and 4b, and then, the electronic component element 1 is inserted between the flat portions 4a and 4a as indicated by an arrow A0 in FIG. 2(B) to hold said element 1 therebetween. In the above state, the flat portions 4a and 4a are soldered onto the electrodes 2 and 3 formed at the opposite ends of the electronic component element 1, and then, after or before coating the electronic component element 1 by an external resin layer (not particularly shown), the wire 4' is cut to form the two lead terminals 4 and 4 at a position close to the bent portion 5 as shown by a chain line L0 in FIG. 2(C). Thus, the electronic component having the lead terminals as shown in FIG. 1 may be obtained.

In the electronic component which employs the wire having the circular cross section for the lead terminals as described above, each of the lead terminals 4 and 4 has a possibility to be bent in any direction due to the circular cross section thereof, and therefore, there has been the problem that the lead terminals 4 and 4 are subjected to bending or deformation during manufacture of the electronic component, thus making it impossible to stably hold the electronic component element 1 inserted between the flat portions 4a and 4a of the lead terminals 4 and 4, and consequently, to perfectly solder said flat portions 4a and 4a to the electrodes 2 and 3. Another disadvantage inherent in the manufacture of the conventional electronic component having the lead terminals of the above described type is that there are involved many processings for the wire such as stretching the cut off wire, which was curved in the arcuate shape, into a straight line, and formation of the flat portions 4a and 4a and the annular protrusions 4b and 4b for positioning on the wire, etc.

SUMMARY OF THE INVNENTION

Accordingly, an essential object of the present invention is to provide an improved electronic component having lead terminals which are not readily subjected to bending or deformation during manufacture for favorable processability.

Another important object of the present invention is to provide a method of manufacturing an electronic component having lead terminals as described above, in which the lead terminals are subjected to less oxidation, and can be soldered favorably for efficient workability at low cost.

In accomplishing these and other objects, according to one aspect of the present invention, there is provided an electronic component with lead terminals, which includes an electronic component element, electrodes respectively formed on opposite end faces of said electronic component element, and lead terminals respectively connected to the electrodes for electrical conduction. Each of the lead terminals has a large width portion formed at one end of its small width tip portion, while the large width portions of the lead terminals are conductively connected to the electrodes of the electronic component element.

In another aspect of the present invention, there is also provided a method of manufacturing an electronic component of the above described type. The method includes the steps of preparing a metallic plate having a predetermined width and length, forming a plurality of openings elongated in the widthwise direction of the metallic plate and arranged at equal intervals along the lengthwise direction of the metallic plate, thereafter, forming a film of a metallic material superior in soldering and oxidation preventing properties, over the surface of the metallic plate, cutting the metallic plate in the widthwise direction through each of the elongated openings so as to form narrow lead plates each having large width portions respectively at opposite ends thereof, bending each of the lead plates approximately at its central portion into a U-shape so that the large width portions thereof confront each other, causing the lead plate to be held on a holder member in a tape-like configuration in such a manner that opposite side portions of the bent portion of the lead plate are directed generally at right angles with the longitudinal direction of the holder member, and inserting the electronic component element between the confronting large width portions of the lead plate in the above state so as to connect the large width portions with the electronic component element for electrical conduction.

In other words, according to the electronic component of the present invention, plate-like lead terminals prepared by blanking a metallic flat plate into a predetermined configuration are connected to electrodes of the electronic component element for electrical conduction, and such lead terminals may be formed into the required shape by blanking through a single step of processing.

Thus, according to the present invention, since the lead terminals of the plate-like shape as employed are readily bent in the direction of thickness, but difficult to be deformed in a direction at right angles with the direction of thickness, bending direction of the lead terminals may be made constant when the electronic component is to be mounted on a printed circuit board, with simultaneous facilitation for adjustment of the interval between the lead terminals. Moreover, owing to the fact that the lead terminals may be prepared by blanking, the stretching step and various shaping steps after cutting as required in the conventional wire of circular cross section wound on a reel become unnecessary, and the manufacture of the lead terminals is markedly facilitated.

Meanwhile, in the manufacturing method of the electronic components according to the present invention, it is so arranged that, through employment of the plate-like lead plates bent into U-shape and the holder member in the form of a tape for holding these lead plates in the state to confront each other, the electronic component element is inserted between the opposite ends of each plate held by the holder member so as to solder the electrodes of said electronic component element with said opposite ends of the lead plate for electrical conduction therebetween, and thus, the production of electronic components with lead terminals is also facilitated. Furthermore, according to the present invention, after the formation of the punched openings, since the metallic plate is coated by the film of a metallic material superior in the soldering property and oxidation preventing property, the lead terminals are subjected to less oxidation, with improvement of soldering property thereof.

BRIEF DESCRIPTION OF THE DRAWINGS

These and other objects and features of the present invention will become apparent from the following description of preferred embodiments thereof with reference to the accompanying drawings, in which:

FIG. 5 is a view similar to FIG. 3, which particularly shows a modification thereof;

FIG. 6 is a side elevational view partly in section, showing the state for mounting the electronic component of FIG. 5 onto a printed circuit board;

FIG. 7 is a perspective view of an electronic component element having a cylindrical configuration to which the present invention may also be applied;

DETAILED DESCRIPTION OF THE INVENTION

Figure 1:
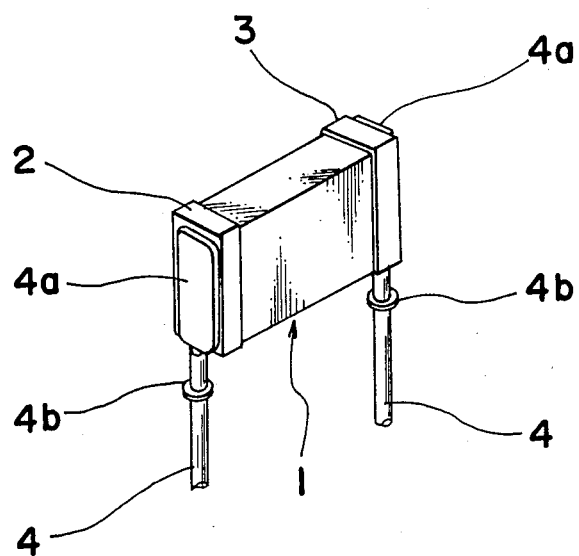
FIG. 1 is a perspective view of a conventional capacitor having lead terminals (already referred to)

Before the description of the present invention proceeds, it is to be noted that like parts are designated by like reference numerals throughout the accompanying drawings.

Figure 3:
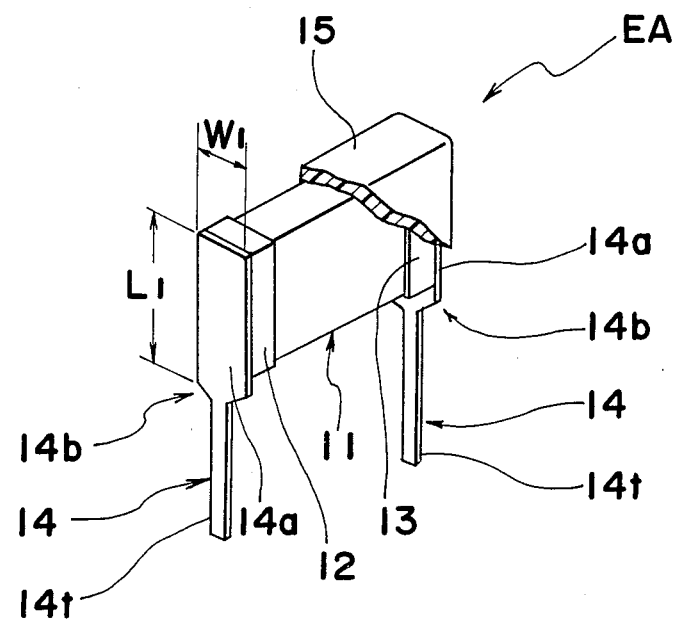
FIG. 3 is a perspective view, partly broken away, showing the construction of an electronic component having lead terminals according to one preferred embodiment of the present invention.

Referring now to the drawings, there is shown in FIG. 3 an electronic component EA with lead terminals according to one preferred embodiment of the present invention, and having a multilayer capacitor as the electronic component element.

The electronic component EA of FIG. 3 includes the multilayer ceramic capacitor 11 of a rectangular cubic configuration formed with electrodes 12 and 13 at opposite side faces thereof, and lead terminals 14 each having a large width portion 14a formed at its one end and a small width tip portion 14t formed at the other end thereof, with a stepped portion 14b being formed therebetween, and soldered, at the large width portions 14a thereof, to the electrode 12 and 13 of the capacitor 11. The large width portion 14a of each lead terminal 14 has a lateral width W1 generally equal to a thickness of the multilayer ceramic capacitor 11, and a length L1 slightly larger than a width of said capacitor 11.

Each of the lead terminals 14 is formed by blanking a metallic plate (not shown here and to be described later with reference to FIG. 8(A)) with a thickness of about 0.25 mm, having a favorable electrical conductivity such as brass, iron, copper, phosphor bronze, nickel silver, etc. into the shape as described above.

After soldering the lead terminals 14 onto the capacitor 11, the multilayer ceramic capacitor 11 and the large width portions 14a of the lead terminals 14 are coated by a layer 15 of electrically insulative resin except for the stepped portions 14b and small width tip portions 14t of the lead terminals 14.

Figure 4:
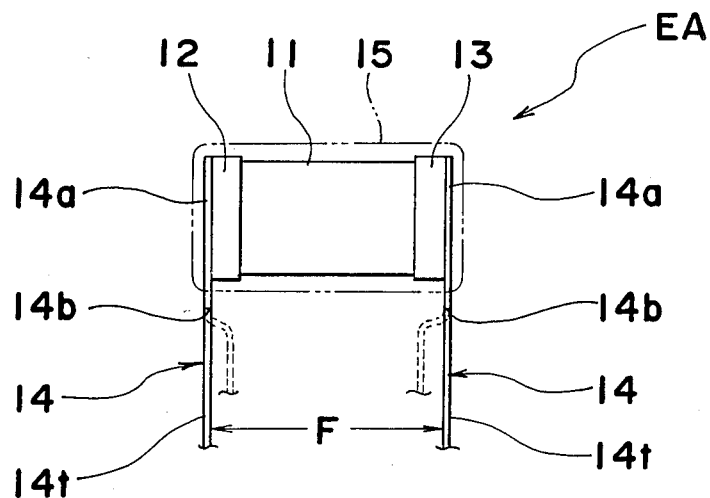
FIG. 4 is a side elevational view of the electronic component of FIG. 3 for explaining adjustment of an interval between the lead terminals thereof.

In the capacitor 11 with lead terminals according to the present invention having the construction as described above, since each of the lead terminals 14 is of a plate-like shape having a predetermined thickness and formed by blanking of a metallic plate, it is readily bent in a direction of its thickness, although it is difficult to be bend it a direction at right angles with the thickness direction thereof. Accordingly, the lead terminals 14 may be adjusted in the interval F between the small width tip portions 14t thereof to correspond to an interval between terminal holes in a printed circuit board (not shown) for actually mounting the capacitor 11 as shown in FIG. 4.

Moreover, the stepped portion 14b formed between the large width portion 14a and the small width tip portion 14t of each lead terminal 14 is brought into contact with the printed circuit board when the capacitor 11 is actually mounted on such printed circuit board so as to function as a positioning portion for said capacitor 11. Furthermore, if the above stepped portion 14b is further formed with a tapered portion toward the small width tip portion 14t, it becomes possible to temporarily fix the capacitor 11 on the printed circuit board by forcibly fitting such taper portions into the terminal holes during actual mounting of the capacitor 11 onto the printed circuit board.

Meanwhile, in the case where the multilayer capacitor 11 is small in size and the interval F between the lead terminals 14 becomes excessively small, it may be so arranged as shown, for example, in a modified electronic component EB of FIG. 5, to increase the interval F by folding the respective lead terminals 14' two times generally at right angles with each other in opposite directions at portions adjacent to the large width portions 14a'. In this arrangement of FIG. 5 also, if the folded lower end portion 14c of each of the large width portion 14a' is adapted to project from the underface of the capacitor element 11 as illustrated, these lower end portions 14c contact the printed circuit board B as shown in FIG. 6 so as to function as stoppers for positioning of the capacitor 11 upon actual mounting of said capacitor onto the printed circuit board B, thus making it unnecessary to effect any special processing to the lead terminals for the positioning of the capacitor.

It is to be noted here that, in the embodiments of FIGS. 3 and 5, the multilayer chip type capacitor 11 may be replaced, for example, by another electronic component including a cylindrical electronic component element 19, and metallic caps 20 respectively applied onto opposite end faces of said element 19 as electrodes, as shown in FIG. 7.

Referring further to FIGS. 8(A) through 8(E), a method of manufacturing the electronic component EA or EB, e.g. the capacitor with lead terminals as shown in FIGS. 3 or 5, will be described hereinbelow.

Figure 8:
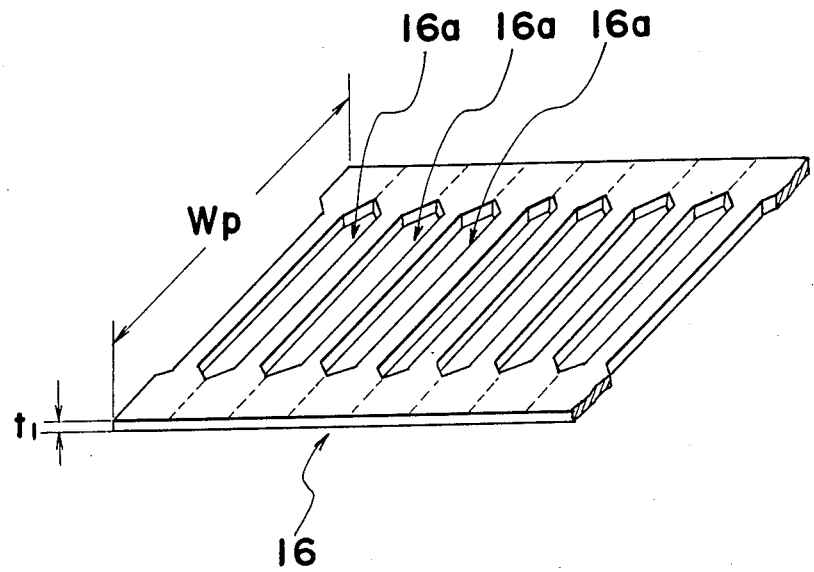
FIG. 8(A) is a perspective view of a metallic plate from which lead plates of the present invention are prepared.
FIG. 8(B) is a top plan view showing, on an enlarged scale, a lead plate obtained from the metallic plate of FIG. 8(A)
FIGS. 8(C), 8(D) and 8(E) are fragmentary perspective views for explaining steps for manufacturing the electronic component having the lead terminals according to the present invention.
FIGS. 8(F) and 8(G) are views similar to Fig. 8(A), which particularly show modifications thereof.
Figure 8:
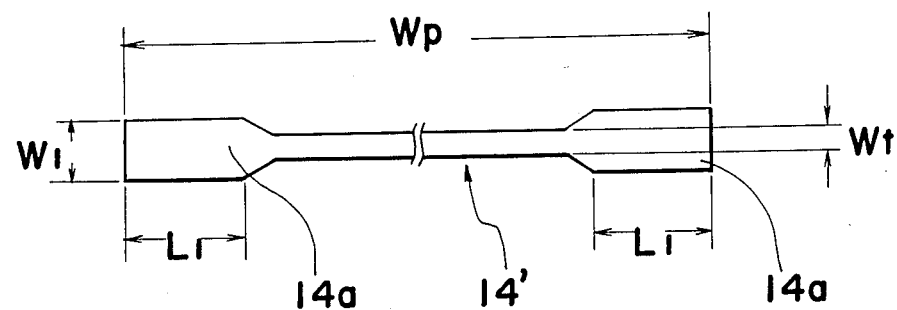

In the first place, as shown in FIG. 8(A), a metallic plate 16 in a belt-like shape having a thickness t1 and a predetermined width Wp is prepared. For a material of the above metallic plate 16, a metallic material such as brass, iron, copper, phosphor bronze, nickel silver or the like having superior electrical conductivity may be employed. The width Wp and thickness t1 of the above metallic plate 16 are selected to be, for example, Wp=84 mm and t1=0.25 mm to correspond to the dimensions of the multilayer chip type capacitor 11, etc.

In the metallic plate 16, a plurality of punched openings 16a each elongated in the widthwise direction of the metallic plate 16 into a slit-like shape, and pointed in a triangular shape at opposite ends thereof, are formed at a predetermined interval along the longitudinal or lengthwise direction of said metallic plate 16. Subsequently, on the surface of the metallic plate 16 formed with the punched openings 16a as described above, a film (not particularly shown) of a metallic material having superior soldering property and oxidation preventing property such as tin, solder or the like is formed. Such a film as referred to above may be formed by immersing the metallic plate 16 into a molten solder or tin, or by plating said plate 16 with solder or tin. Thereafter, the metallic plate 16 is cut off at a line passing through a center of each of the punched openings 16a as indicated by dotted lines in FIG. 8(A), and thus, lead plates 14' each having the large width portions 14a at the opposite ends thereof as shown in FIG. 8(B) are obtained. In the above lead plate 14', the width W1 and length L1 of each large width portion 14a are generally equal to the dimensions at the opposite end faces of the multilayer chip type capacitor 11, and are set to be, for example, W1=1 mm and L1=4 mm, with a width Wt of the small width tip portion 14t being set at Wt=0.5 mm.

Figures 2A, 2B, 2C:
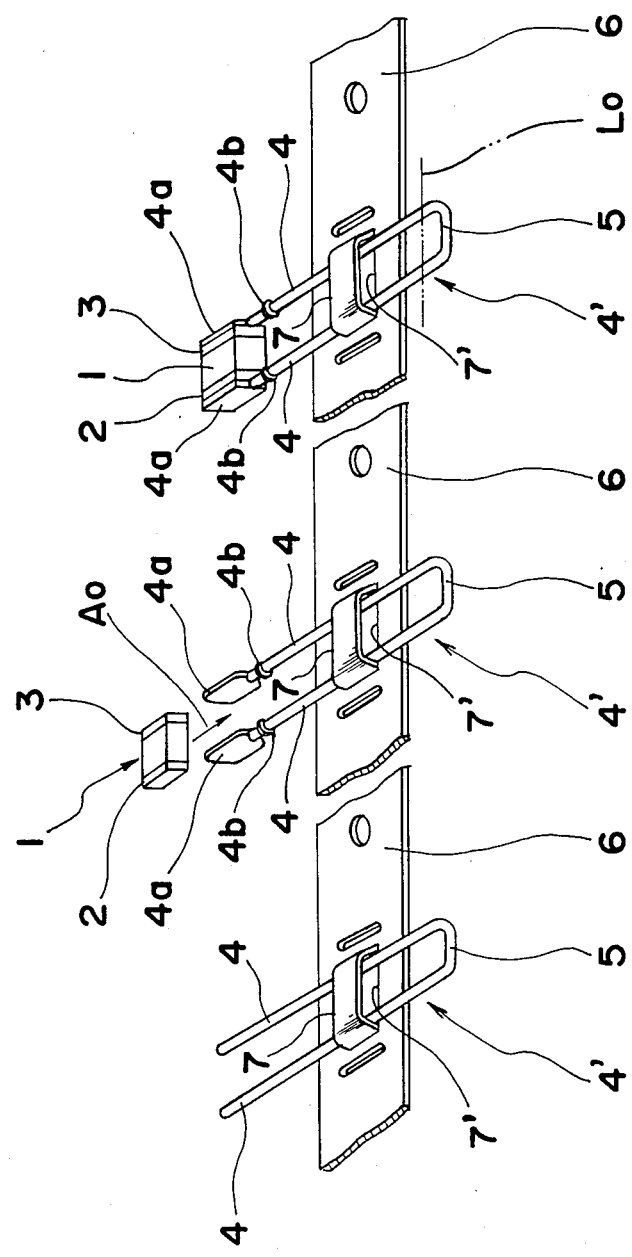
FIGS. 2(A), 2(B) and 2(C) are fragmentary perspective views for explaining steps for manufacturing the conventional capacitor having the lead terminals of FIG. 1 (already referred to)

As shown in FIG. 8(C), each of the lead plates 14' is bent into a U-shape generally at its central portion "U" so that the large width portions 14a confront each other, and is held on a holder tape T as a holder member made of a flexible material such as paper, resin or the like. The holding of the lead plate 14' by the holder tape T as referred to above is effected by slits 18 and 18' preliminarily formed in the holder tape T, in a procedure similar to that described earlier with reference to the conventional practice of FIG. 2(A).

More specifically, in the holder tape T, along the longitudinal direction thereof, a pair of slits 18 and 18' having a length generally equal to an interval "d" between the confronting large width portions 14a of the lead plate 14' are formed for each of the lead plates 14'. The lead plate 14' is inserted at its central bent portion "U" into one slit 18 from the front face of the holder tape T toward the rear face thereof, and further, led into the other slit 18' from the rear face onto the front face of the holder tape T, and thus, each of the lead plates 14' is held on the holder tape T in such a manner that opposite side portions for the bent portion "U" of the lead plate 14' are directed generally at right angles with the longitudinal direction of said holder tape T.

Subsequently, the multilayer chip type capacitor 11 is inserted between the large width portions 14a of the lead plate 14' in the direction as indicated by the arrow A1 in FIG. 8(D). In the above case, for the electronic component EA of FIG. 3, the capacitor 11 formed with the electrodes 12 and 13 at opposite end faces thereof is inserted between the large width portions 14a without shaping as shown in FIG. 8(C), while for the electronic component EB of FIG. 5, said capacitor 11 is inserted between the large width portions 14a which are shaped to be narrow in its interval to correspond to the distance between the electrodes 12 and 13 of the capacitor 11, and thus, the multilayer chip type capacitor 11 is held between said large width portions 14a of the lead plate 14'.

In the above state, the large width portions 14a of said lead plate 14' are preliminarily heated depending on necessity, and then, such large width portions 14a are soldered onto the electrodes 12 and 13 of the capacitor 11.

Thereafter, as shown by a chain line L2 in FIG. 8(E), the lead plate 14' thus held on the holder tape T is cut in a position adjacent to the bent portion "U" for separation into the two lead terminals 14, and after measuring characteristics such as electrostatic capacity between the two terminals 14, etc., the multilayer chip type capacitor 11 is coated by the electrically insulative resin layer 15 (FIG. 3 or FIG. 5). When the electronic component is detached from the holder tape T, for example, by cutting the lead terminals at a predetermined position, the electronic component EA or EB as described earlier with reference to FIG. 3 or FIG. 5 may be obtained. In this case, the above coating process by the resin 15 may be modified to be effected in the step prior to the cutting of the lead plate 14' for separation into the two lead terminals 14.

By the method according to the present invention as described above, since the lead terminals 14 superior in oxidation preventing property and soldering property may be obtained merely by cutting off the metallic plate 16 formed with the punched openings and the metallic coating favorable in the above properties, manufacture of the lead terminals 14 is markedly facilitated, while furthermore, the capacitors having lead terminals can be continuously produced by an automatic machine through utilization of the holder tape T. Furthermore, in the capacitor of FIG. 3 or FIG. 5 manufactured in the manner as described so far, owing to the fact that the lead terminals 14 are formed through blanking of the metallic plate 16, there is no possibility that the lead terminals 14 are deformed in a direction normal to the direction of thickness thereof in the manufacturing process of said capacitor.

It should be noted here that the shaping step at the large width portions 14a of the lead plate 14' for narrowing the interval "d" therebetween as in FIG. 8(D) may be omitted in the case where the size of the capacitor 11 is large as compared with the distance "d" before the shaping step. Also, the holder tape T may be modified to a holder member including a base tape and an adhesive tape to be applied onto the base tape (not shown) so as to hold the lead plates 14 therebetween.

Figure 8F:
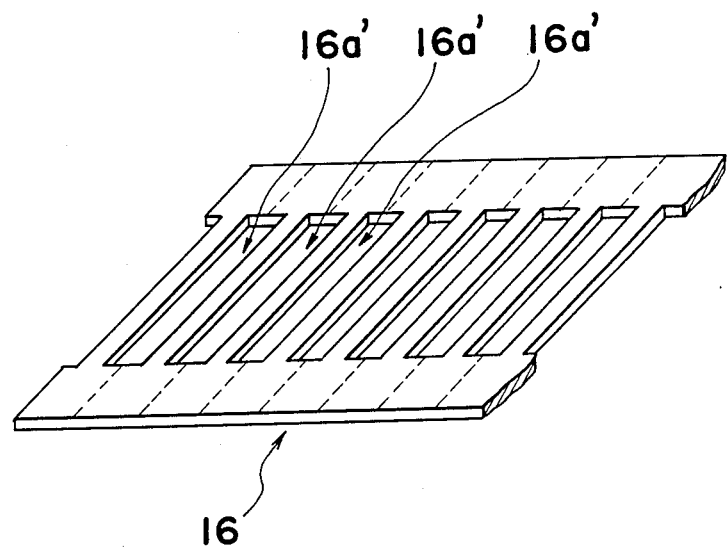
Figure 8G:
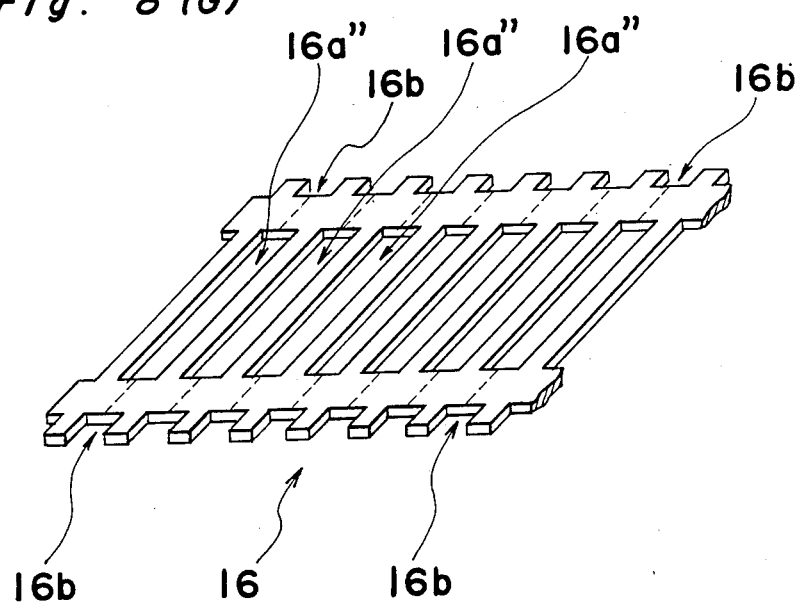

It should also be noted that each of the punched openings to be formed in the metallic plate 16 is not limited to the opening 16a pointed at its opposite ends in the triangular shape as in FIG. 8(A), but may be modified, for example, into slit-like rectangular openings 16a' as shown in FIG. 8(F), or similar rectangular openings 16a" respectively having confronting notches 16b formed in the plate 16 at positions corresponding to opposite ends of each of said openings 16a".

Although the present invention has been described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A method of manufacturing an electronic component including lead terminals respectively connected to electrodes formed on opposite end faces of an electronic component element, said method comprising the steps of
    preparing a metallic plate having predetermined width and length,
    forming a plurality of openings elongated in the widthwise direction of the metallic plate and arranged at equal intervals along a lengthwise direction of said metallic plate,
    thereafter, forming a film of a metallic material superior in soldering and oxidation preventing properties over the surface of said metallic plate,
    cutting said metallic plate in the widthwise direction through each of said elongated openings so as to form narrow lead plates each having large width portions respectively at opposite ends thereof,
    bending each of said lead plates approximately at its central portion into a U-shape so that said large width portions thereof confront each other,
    causing said lead plate to be held on a holder member in a tape-like configuration in such a manner that opposite side portions of the bent portion of said lead plate are directed generally at right angles with the longitudinal direction of said holder member, and
    then, inserting the electronic component element between the confronting large width portions of the lead plate so that said large width portions contact said electrodes of said electronic component element for electrical connection.

2. A method as claimed in claim 1, wherein each of said elongated openings has a slit-like shape pointed in a triangular configuration at opposite ends thereof.

3. A method as claimed in claim 1, wherein each of said elongated openings has a slit-like rectangular shape.

4. A method as claimed in claim 1, wherein each of said elongated openings has a slit-like rectangular shape, with confronting notches formed in said metallic plate at positions corresponding to opposite ends of each of said openings.

5. A method as claimed in claim 1, further including the step of shaping the lead plate so that an interval between the confronting large width portions becomes smaller to correspond to the distance between the end faces of said electronic component element where said electrodes are formed.

6. A method as claimed in claim 1, wherein said large width portions are connected to said electrodes by soldering.

* * * * *